US012770692B2

(12) United States Patent
Chou et al.

(10) Patent No.: US 12,770,692 B2
(45) Date of Patent: Oct. 20, 2026

(54) EXTRACTION METHOD OF PHYSICALLY UNCLONABLE FUNCTION AND MEMORY DEVICE

(71) Applicant: MACRONIX International Co., Ltd., Hsinchu (TW)

(72) Inventors: You-Liang Chou, Taichung City (TW); Wen-Jer Tsai, Hualien County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 140 days.

(21) Appl. No.: 18/926,243

(22) Filed: Oct. 24, 2024

(65) Prior Publication Data

US 2025/0384934 A1 Dec. 18, 2025

Related U.S. Application Data

(60) Provisional application No. 63/661,055, filed on Jun. 18, 2024.

(51) Int. Cl.
*G11C 16/22* (2006.01)
*G06F 7/58* (2006.01)
(Continued)

(52) U.S. Cl.
CPC .............. *G11C 16/22* (2013.01); *G06F 7/588* (2013.01); *G11C 16/0483* (2013.01); *G11C 16/24* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 10,243,749 | B2 * | 3/2019 | Park | G09C 1/00 |
| 2019/0068190 | A1 * | 2/2019 | Karpinskyy | H03K 19/003 |
| 2024/0145002 | A1 | 5/2024 | Park et al. | |

FOREIGN PATENT DOCUMENTS

| | | |
|---|---|---|
| CN | 116129955 | 5/2023 |
| CN | 117316246 | 12/2023 |
| TW | 202324398 | 6/2023 |

OTHER PUBLICATIONS

Shubham Sahay et al., "Hardware Security Primitive Exploiting Intrinsic Variability in Analog Behavior of 3-D NAND Flash Memory Array", IEEE Transactions on Electron Devices, vol. 66, May 2019, pp. 2158-2164.

(Continued)

*Primary Examiner* — Charles J Choi
(74) *Attorney, Agent, or Firm* — J.C. PATENTS

(57) ABSTRACT

Disclosed are an extraction method for a physically unclonable function (PUF) and a memory device. The memory device may be a three-dimensional NAND flash memory with high capacity and high performance. The extraction method includes: providing a memory block, the memory block includes a plurality of memory sub-blocks; selecting a plurality of memory sub-blocks to be chosen among the memory sub-blocks; forming a combination of the memory sub-blocks to be chosen among the memory sub-blocks to be chosen; selecting a plurality of bits to be chosen among bits of a preset memory area in each of the memory sub-blocks to be chosen; performing a weak PUF processing operation on the preset memory area in each of the memory sub-blocks to be chosen; and, performing a multi-sub-block read operation to the preset memory area in the combination to extract a strong PUF data according to the bits to be chosen in the preset memory area read by the multi-sub-block read operation.

12 Claims, 8 Drawing Sheets

(51) Int. Cl.
*G11C 16/04* (2006.01)
*G11C 16/24* (2006.01)
*G11C 16/26* (2006.01)

(56) References Cited

OTHER PUBLICATIONS

"Office Action of Taiwan Counterpart Application", issued on Jun. 25, 2025, p. 1-p. 8.

* cited by examiner

EXTRACTION METHOD OF PHYSICALLY UNCLONABLE FUNCTION AND MEMORY DEVICE

CROSS-REFERENCE TO RELATED APPLICATION

This application claims the priority benefit of U.S. provisional application Ser. No. 63/661,055, filed on Jun. 18, 2024. The entirety of the above-mentioned patent application is hereby incorporated by reference herein and made a part of this specification.

BACKGROUND

Technical Field

The present invention relates to a corresponding technology applied to a memory device (such as a NAND flash memory), and in particular to an extraction method of a physically unclonable function (PUF) and a memory device.

Description of Related Art

High-capacity and high-performance integrated circuit memories including 3D NAND flash memory are in continuing development in the hope of using 3D stacking technology and triple-level cells (TLC) to reduce the size of memory cells and increase data storage density. On the other hand, the principle of physically unclonable function (PUF) technology lies in process variability which allows components manufactured through semiconductor processes to generate highly random and unpredictable data. The data has uniqueness and may be used for identity verification, device security key, communication security and other purposes.

PUF technology is commonly adopted, and it is expected that PUF technology is able to generate a large number of PUF data based on the same integrated circuit memory combined with various methods (for example, permutation and combination of data) to meet the requirement of different PUF technologies. Therefore, how to generate a large number of PUF data based on the same integrated circuit memory is one of the issues to be overcome.

SUMMARY

The present invention provides an extraction method for a physically unclonable function (PUF) and a memory device in the hope of extracting a large number of strong PUF data based on the existing hardware structure and mathematical permutations and combinations of a memory device.

The present invention provides an extraction method for a physically unclonable function (PUF). The extraction method includes: providing a memory block, the memory block includes a plurality of memory sub-blocks, the memory sub-blocks include a plurality of memory cells, and the memory cells are divided into a plurality of memory areas; selecting a plurality of memory sub-blocks to be chosen among the memory sub-blocks; forming a combination of the memory sub-blocks to be chosen among the memory sub-blocks to be chosen; selecting a plurality of bits to be chosen among a plurality of bits of a preset memory area in each of the memory sub-blocks to be chosen, the preset memory area is one of the memory areas in each of the memory sub-blocks to be chosen; performing a weak PUF processing operation on the preset memory area in each of the memory sub-blocks to be chosen; and, performing a multi-sub-block read operation on the preset memory area in the combination of the memory sub-blocks to be chosen to extract a strong PUF data according to the bits to be chosen in the preset memory area read through the multi-sub-block read operation.

The present invention provides a memory device. The memory device includes a memory array, a memory controller, a bit line decoder, and a sub-block selection circuit. The memory array includes a memory block. The memory block includes a plurality of memory sub-blocks, the memory sub-blocks include a plurality of memory cells, and the memory cells are divided into a plurality of memory areas. The memory controller is coupled to the memory array. The bit line decoder is coupled to the memory controller. The sub-block selection circuit is coupled to the memory controller. The memory controller is configured to: select a plurality of memory sub-blocks to be chosen among the memory sub-blocks; form a combination of the memory sub-blocks to be chosen among the memory sub-blocks to be chosen; select a plurality of bits to be chosen among a plurality of bits of a preset memory area in each of the memory sub-blocks to be chosen, the preset memory area is one of the memory areas in each of the memory sub-blocks to be chosen; perform a weak PUF processing operation on the preset memory area in each of the memory sub-blocks to be chosen; and, perform a multi-sub-block read operation on the preset memory area in the combination of the memory sub-blocks to be chosen to extract a strong PUF data according to the bits to be chosen in the preset memory area read through the multi-sub-block read operation.

The present invention provides an extraction method for a physically unclonable function (PUF). The extraction method includes: providing a memory block, the memory block includes a plurality of memory sub-blocks, the memory sub-blocks include a plurality of memory cells, and the memory cells are divided into a plurality of memory areas; selecting M memory sub-blocks to be chosen from the memory sub-blocks, and M is a positive integer; forming a combination of the memory sub-blocks to be chosen among the M memory sub-blocks to be chosen; selecting N bits to be chosen among a plurality of bits of a preset memory area in each of the M memory sub-blocks to be chosen, and N is a positive integer, the preset memory area is one of the memory areas in each of the M memory sub-blocks to be chosen; performing a weak PUF processing operation on the preset memory area in each of the M memory sub-blocks to be chosen; and, performing a multi-sub-block read operation on the preset memory area in the combination of the memory sub-blocks to be chosen to extract a strong PUF data according to the N bits to be chosen in the preset memory area read through the multi-sub-block read operation.

Based on the above, the extraction method for a physically unclonable function (PUF) and the memory device described in the embodiments of the present invention are operated mainly based on the existing hardware structure (e.g., bit line decoder, sub-block selection circuit) of the memory device and some additional hardware (e.g., corresponding functions added to the memory controller) while utilizing the selection of the memory device on each memory sub-block, the selection of the memory device on the combination of memory sub-blocks, the selection of the memory device on the preset memory area (such as the default page in the memory sub-block) in the memory sub-block, and the selection of the memory device on a plurality of bits in the preset memory area, thereby performing mathematical permutations and combinations to extract a large amount of strong PUF data. Moreover, in this embodiment, the strong PUF data may be extracted without setting an additional comparator circuit, and the data throughput of strong PUF data may be increased.

DESCRIPTION OF THE EMBODIMENTS

Figure 1:
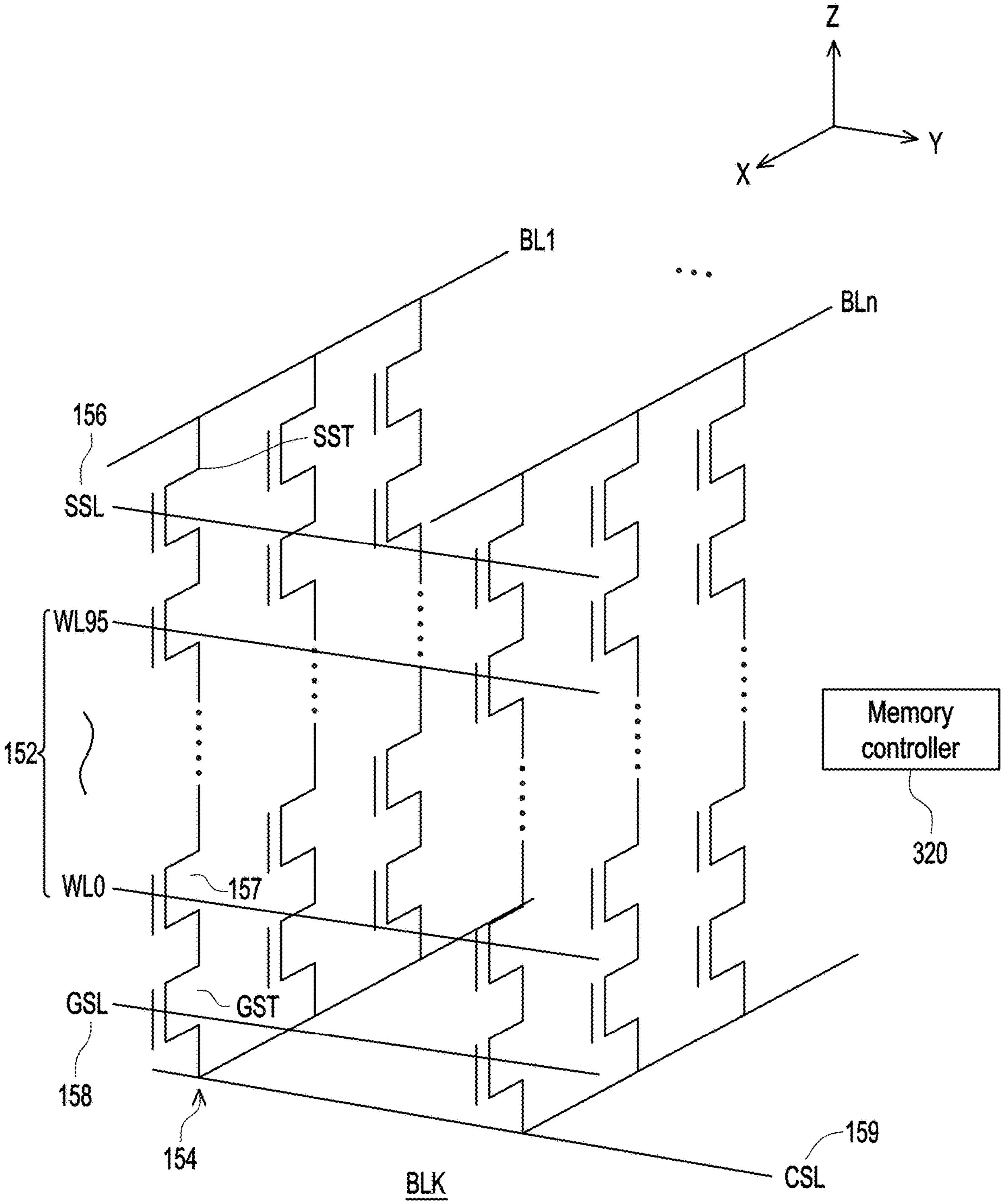
FIG. 1 is a schematic structural diagram of a memory block and a memory controller 320 in a three-dimensional memory chip according to an embodiment of the present invention.
Figure 2:
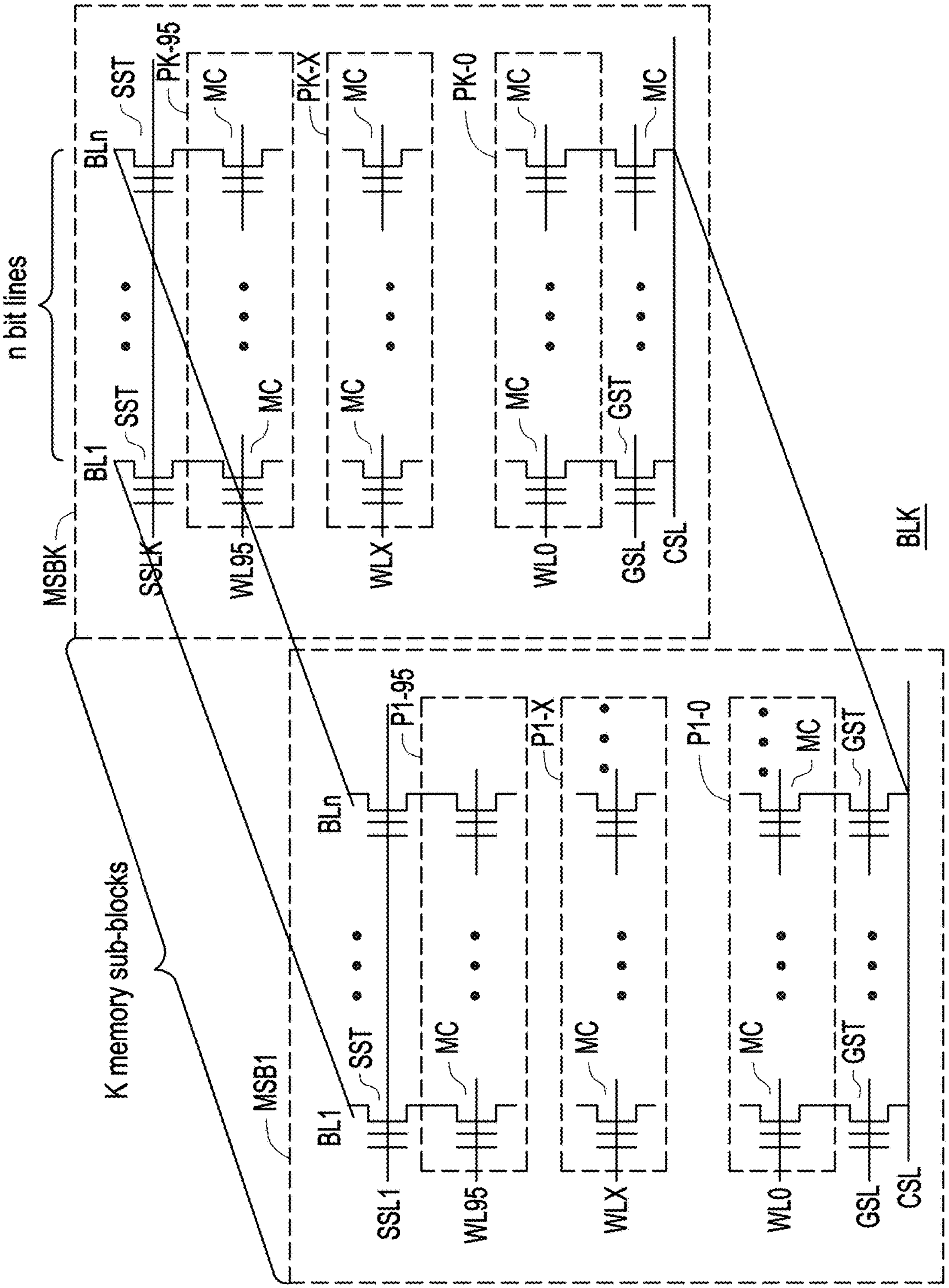
FIG. 2 is a schematic diagram of multiple memory sub-blocks in a memory block and each page in each memory sub-block according to an embodiment of the present invention.

FIG. 1 is a schematic structural diagram of a memory block BLK and a memory controller 320 in a three-dimensional memory chip according to an embodiment of the present invention. FIG. 2 is a schematic diagram of a plurality of memory sub-blocks MSB1 to MSBK in the memory block BLK and pages (e.g., pages P0 to P95) in each memory sub-block according to an embodiment of the present invention. Please refer to FIG. 1 and FIG. 2 at the same time. The three-dimensional memory chip may include K memory sub-blocks MSB1 to MSBK, a plurality of word lines WL0 to WL95 and n bit lines BL1 to BLn, wherein K and n are both positive integers. Each memory sub-block MSB1 to MSBK includes a plurality of memory cells MC.

These memory cells are configured in three dimensions, for example, XYZ coordinate system. Taking the memory cell 157 in FIG. 1 as an example, the memory cell 157 is coupled to the corresponding word line WL0 and bit line BL1. FIG. 1 mainly shows the three-dimensional memory block BLK and the memory cell string 154. FIG. 2 mainly shows the structures of the plurality of memory sub-blocks MSB1 to MSBK in the memory block BLK and various pages (for example, pages P0 to P95) in each of memory sub-blocks MSB1 to MSBK.

Each of the memory sub-blocks MSB1 to MSBK includes a plurality of memory cells MC. In other words, the memory cells MC in the memory block BLK may be divided into a plurality of memory sub-blocks MSB1 to MSBK in FIG. 2 based on each YZ plane in FIG. 1. Each of the memory sub-blocks MSB1 to MSBK may be selected through the string selection lines SSL1 to SSLK in FIG. 2. The plurality of memory cells in the memory cell string 154 in FIG. 1 belong to different pages.

Taking the memory sub-block MSB1 in FIG. 2 as an example, the word lines (such as word lines WL0 to WL95) formed by the conductive layer or the word line layer and the plurality of memory cells coupled thereto are divided into a plurality of pages (such as pages P1-0 to P1-95). Memory cells on the same layer (same page) may be coupled to the same word line (e.g., word line WL0 or WL95) and corresponding word line voltages may be obtained. Memory cells on different layers (different pages) are coupled to different word lines (e.g., word lines WL0 and WL95) and different word line voltages may be obtained. In other words, a page in the memory sub-block MSB1 is composed of a memory cell connected to one of the corresponding plurality of word lines (for example, one of the word lines WL0 to WL95) in the memory cell strings. Each page may be connected to a corresponding contact in the driving circuit, such as a scan driver, through one of the word lines WL0 to WL95 coupled to the page. Each line has a corresponding voltage driver, and the voltage drivers may be controlled by the memory controller 320 or corresponding hardware.

Each memory cell string (e.g., memory cell string 154) in FIG. 1 includes a plurality of memory cells connected in series vertically along the Z direction. The memory cell string includes a plurality of memory cells (e.g., memory cell 157), a string selection transistor SST coupled to a string selection line SSL 156, and a ground selection transistor GST coupled to a ground selection line GSL 158. The memory cell string 154 is connected to one or more drivers, such as data drivers. The memory cell 157 is connected to the common source line CSL 159 via the ground selection transistor GST. The string selection line SSL 156 may be a conductive line or a conductive layer formed on the top of each page (or word line layer). The memory block BLK may include a plurality of string selection lines SSL 156 on the top page. The ground selection line GSL 158 may be a conductive line or a conductive layer formed on the bottom of each page (or word line layer). The common source line CSL 159 may be a conductive layer or a plurality of conductive lines formed under the ground selection line GSL 158 and on the substrate of the three-dimensional memory chip. Several dummy lines or corresponding layers (not shown) may further be disposed between the string selection line SSL 156 and the uppermost page, or between the ground selection line GSL 158 and the lowermost page.

The memory device of this embodiment may include a memory array and a memory controller (e.g., the memory controller 320 in FIG. 1). The memory array may include one or more memory blocks BLK as described in FIG. 1. Each memory block BLK includes a plurality of memory sub-blocks MSB1 to MSBK, each of the memory sub-blocks MSB1 to MSBK includes a plurality of memory cells, and the memory cells are divided into a plurality of memory areas. Each memory area is one page or part of a page among a plurality of pages (for example, pages P1-0 to P1-95) of the memory block BLK. The memory cells in each page are coupled to the same word line. Those who apply this embodiment may adjust the size of the memory area or preset memory area according to needs. For example, the memory area may be set to a whole page P1-X, or ½, ⅓ or ⅛ pages P1-X.

The memory cells in the memory block BLK may belong to single-level memory cells (SLC) or multi-level memory cells. A "multi-level memory cell" is, for example, one of a multi-level memory cell (MLC), a triple-level memory cell (TLC), and a quad-level memory cell (QLC). The memory cell in the memory device and the memory block BLK of this embodiment adopts a triple-level memory cell (TLC) as an example.

In the corresponding embodiments of the present invention, it is possible to select multiple mathematical permutations and combinations in a three-dimensional memory device (e.g., three-dimensional flash memory), such as the selection of each memory sub-block, the selection of the combination of memory sub-blocks, the selection of the preset memory area in the memory sub-block, and the selection of a plurality of bits in the preset memory area. Moreover, after performing the weak PUF processing operation on the selected preset memory area, the multi-sub-block read operation is performed on the preset memory area (such as default page) in the combination of the aforementioned selected memory sub-blocks, and part of the memory area in the selected memory device. In this way, this embodiment may extract a large number of strong PUF data based on a single memory device to meet the application requirements of different PUF technologies.

Figure 3:
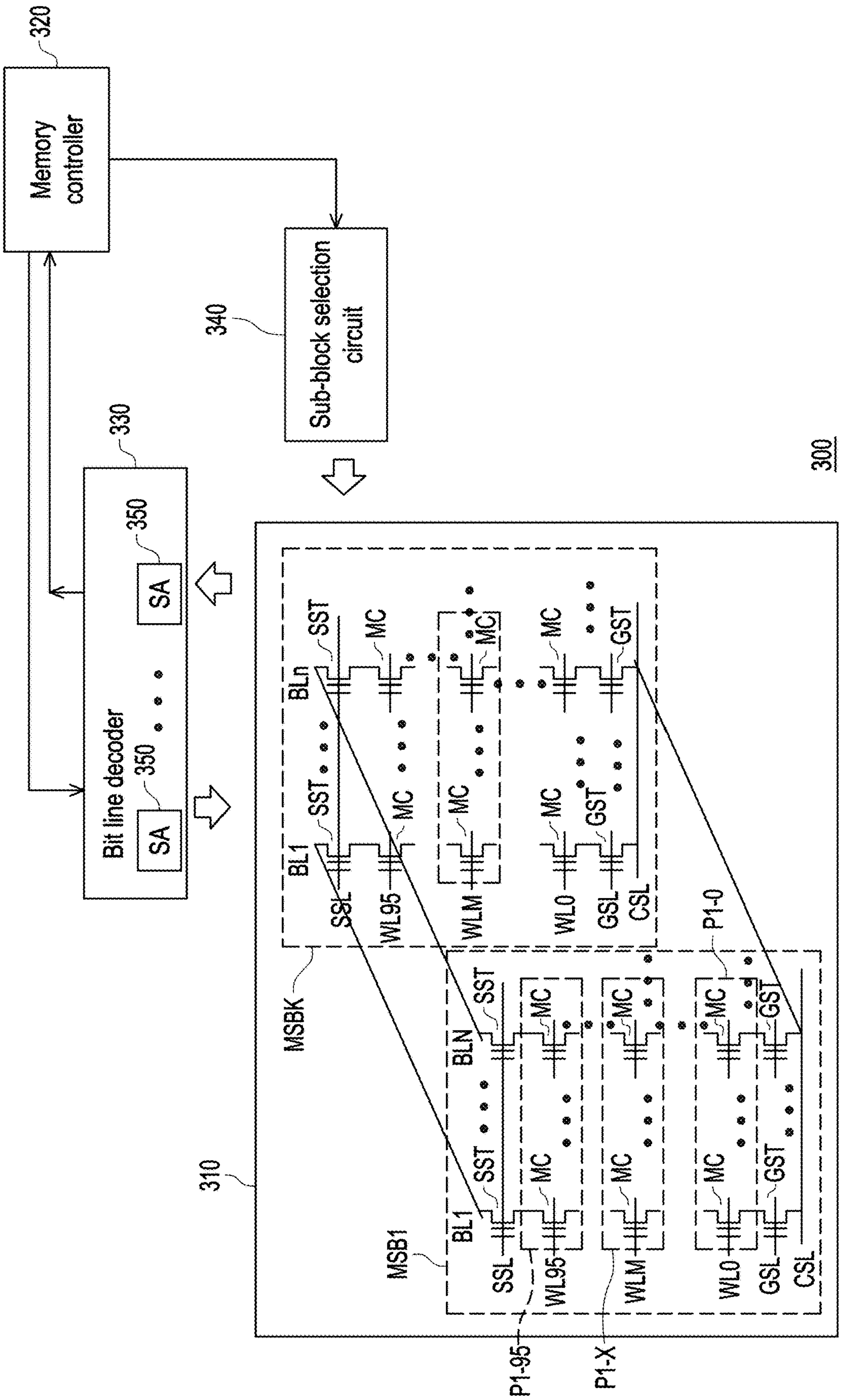
FIG. 3 is a block diagram of a memory device according to an embodiment of the present invention.

FIG. 3 is a block diagram of a memory device 300 according to an embodiment of the present invention. The memory device 300 mainly includes a memory array 310, a memory controller 320, a bit line decoder 330 and a sub-block selection circuit 340. The memory array 310 includes the memory block BLK shown in FIG. 1 and FIG. 2. The memory block BLK includes a plurality of memory sub-blocks MSB1 to MSBK. Each of the memory sub-blocks respectively includes a plurality of memory cells MC. The memory cells MC are divided into a plurality of memory areas, such as pages P1-0 to P1-95 and PK-0 to PK-95. The memory controller 320 is coupled to the memory array 310. The bit line decoder 330 and the sub-block selection circuit 340 are coupled to the memory controller 320.

The bit line decoder 330 may include a plurality of sense amplifiers SA 350. Each of the sense amplifiers SA 350 is coupled to the corresponding bit lines BL1 to BLn respectively to obtain the induced current on the corresponding bit lines BL1 to BLn to extract the strong PUF data. In this embodiment, the number of bit lines BL1 to BLn may be 16 kB.

The sub-block selection circuit 340 may be a string selection line decoder (SSL decoder). The memory controller 320 enables the corresponding string selection lines SSL1 to SSLK through the sub-block selection circuit 340 to select a part of the memory sub-blocks from the K memory sub-blocks MSB1 to MSBK to be used as the memory sub-blocks for extracting the strong PUF data. The memory controller 320 controls the memory array 310, the bit line decoder 330 and the sub-block selection circuit 340 to implement the extraction methods and detailed steps in various embodiments of the present invention.

Figure 4:
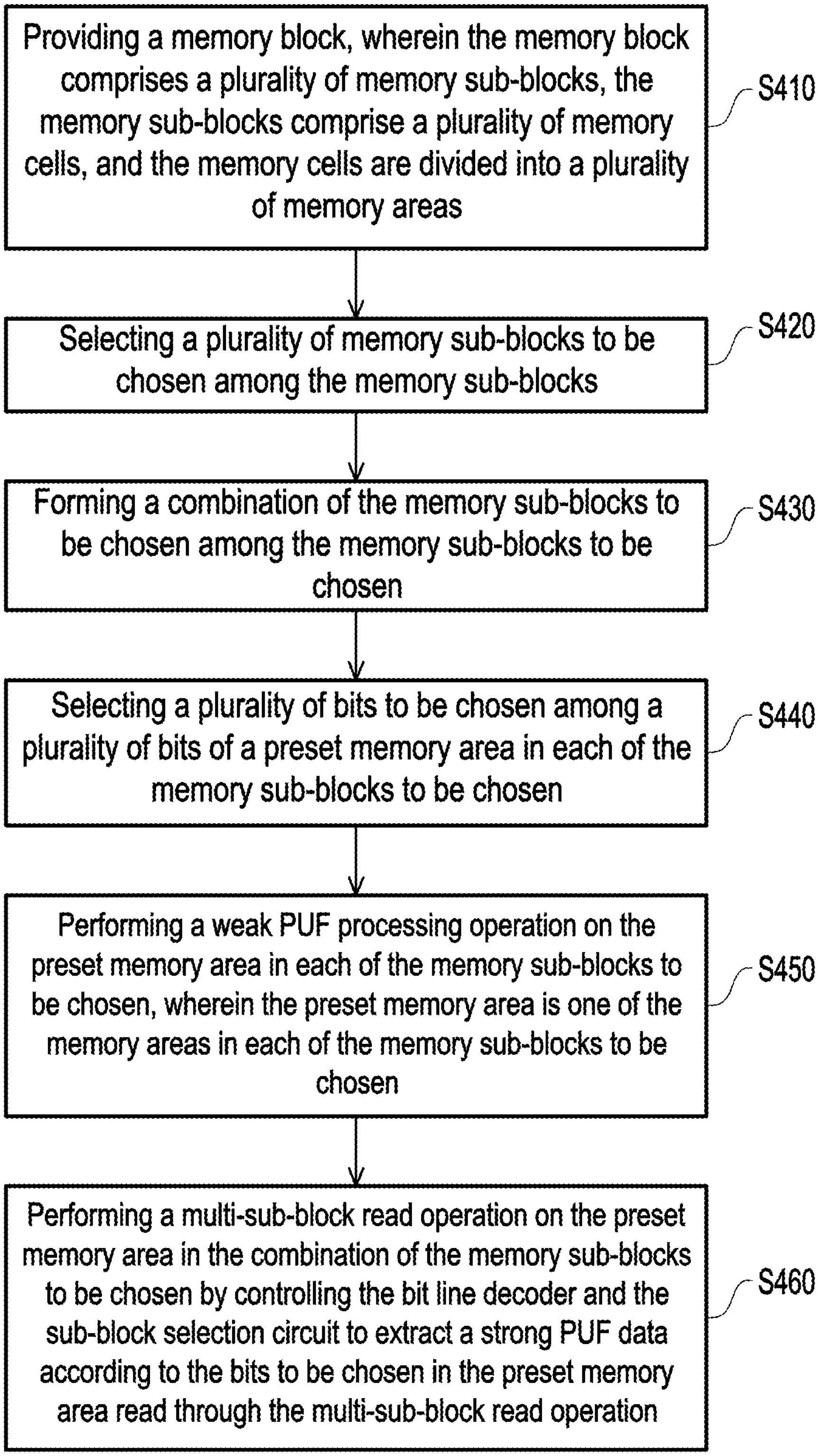
FIG. 4 is a flow chart of an extraction method for a physically unclonable function (PUF) according to an embodiment of the present invention.

FIG. 4 is a flow chart of an extraction method for a physically unclonable function (PUF) according to an embodiment of the present invention. The extraction method of FIG. 4 is applicable to the memory device 300 of FIG. 3. The memory array 310 in the memory device 300 in FIG. 3 includes the memory block BLK in FIG. 1 and FIG. 2. Those who apply this embodiment may implement steps S420 to S440 in FIG. 4 on the memory controller 320 by inputting commands. In this embodiment, through the extraction method of FIG. 4 and the memory device 300 of FIG. 3, a large number of PUF data (also known as strong PUF data) is extracted from a small number of PUF data (also known as weak PUF data), which is also known as “challenge”. Those who apply this embodiment may implement the “challenge” by inputting commands to the memory controller 320. On the other hand, a large number of strong PUF data extracted through the extraction method in FIG. 4 is referred to as “response”.

Referring to FIG. 4, in step S410 of FIG. 4, the memory block BLK is provided, as shown in FIG. 1 and FIG. 2. The memory block BLK includes a plurality of memory sub-blocks MSB1 to MSBK. Each of the memory sub-blocks MSB1 to MSBK includes a plurality of memory cells MC. The memory cells MC are divided into a plurality of memory areas, such as a plurality of pages P1-0 to P1-95 in the memory sub-block MSB1.

Steps S420 to S440 in FIG. 4 are detailed steps for selecting multiple mathematical permutations and combinations for the memory device 300 in this embodiment. Those who apply this embodiment may implement various selections in steps S420 to S440 through commands.

In step S420 of FIG. 4, the memory controller 320 selects a plurality of memory sub-blocks to be chosen (for example, M memory sub-blocks to be chosen) from a plurality of memory sub-blocks (for example, K memory sub-blocks MSB1 to MSBK in FIG. 2). The value of “K” is the hardware configuration of the memory device 300, and the value of “M” is the value that the user who applies this embodiment may adjust according to needs. For convenience of explanation, in this embodiment, K is set to “2000”, and M is assumed to be “33”. Therefore, step S420 in FIG. 4 may generate 33 permutations and combinations from 2000 (i.e., C2000). In other words, it selects 33 memory sub-blocks among 2000 memory sub-blocks MSB1 to MSB2000 (with C2000 possible combinations) in the embodiment.

Figure 5:
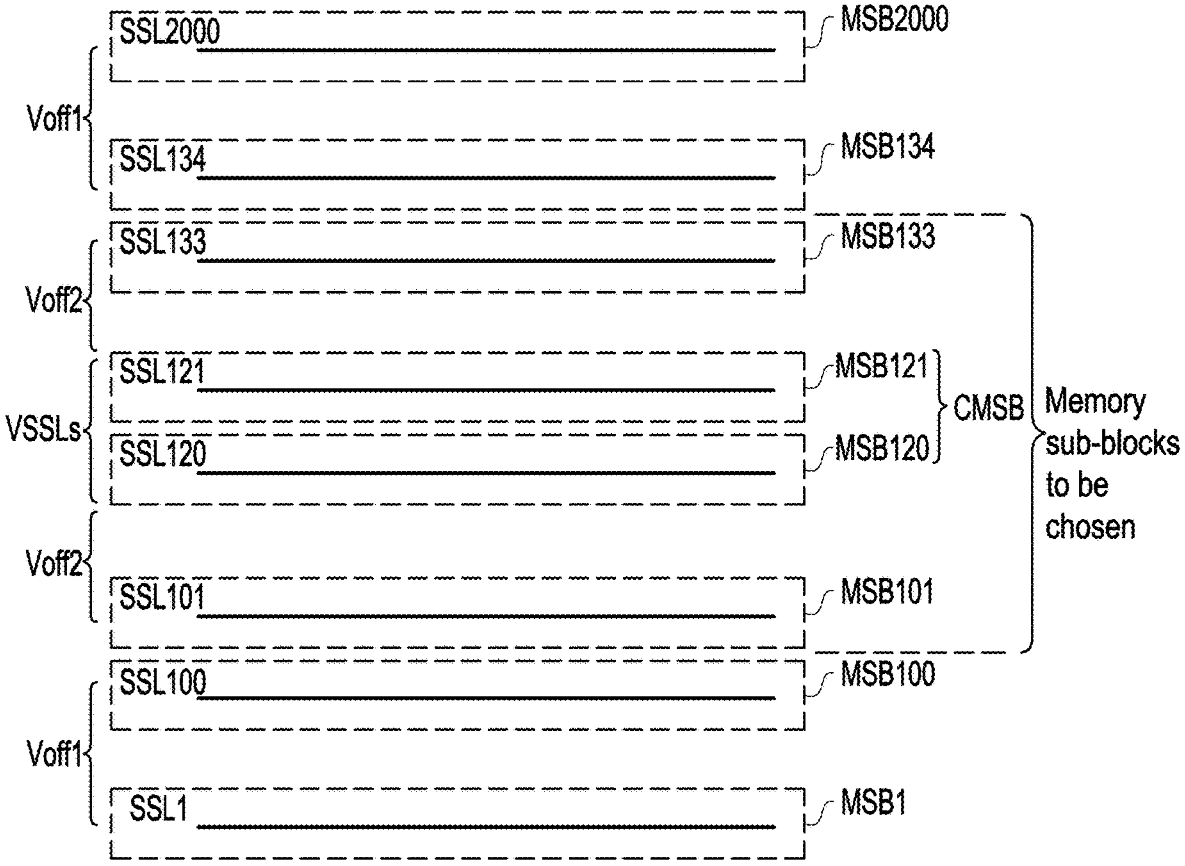
FIG. 5 is a schematic diagram of various steps in FIG. 4 as an example of this embodiment.

FIG. 5 is a schematic diagram of various steps in FIG. 4 as an example of this embodiment. In FIG. 5, there are a total of 2000 memory sub-blocks MSB1 to MSB2000, that is, K equals to 2000. This embodiment assumes that 33 memory sub-blocks MSB101 to MSB133 are used as M memory sub-blocks to be chosen Returning to step S430 in FIG. 4, the memory controller 320 forms a combination of the memory sub-blocks to be chosen in the M memory sub-blocks to be chosen. This embodiment selects a part of the M memory sub-blocks to be chosen as the combination. The combination may be composed of one memory sub-block to be chosen, two memory sub-blocks to be chosen, three memory sub-blocks to be chosen . . . or 33 memory sub-blocks to be chosen and serve as one of the selections for the aforementioned “challenge”. Step S430 in FIG. 4 may generate 2 to the power of M (e.g., M equals to 33) permutations and combinations (i.e., 233). In other words, it performs switch combinations based on these 33 memory sub-blocks (with 233 possible combinations) in this embodiment.

Figure 6:
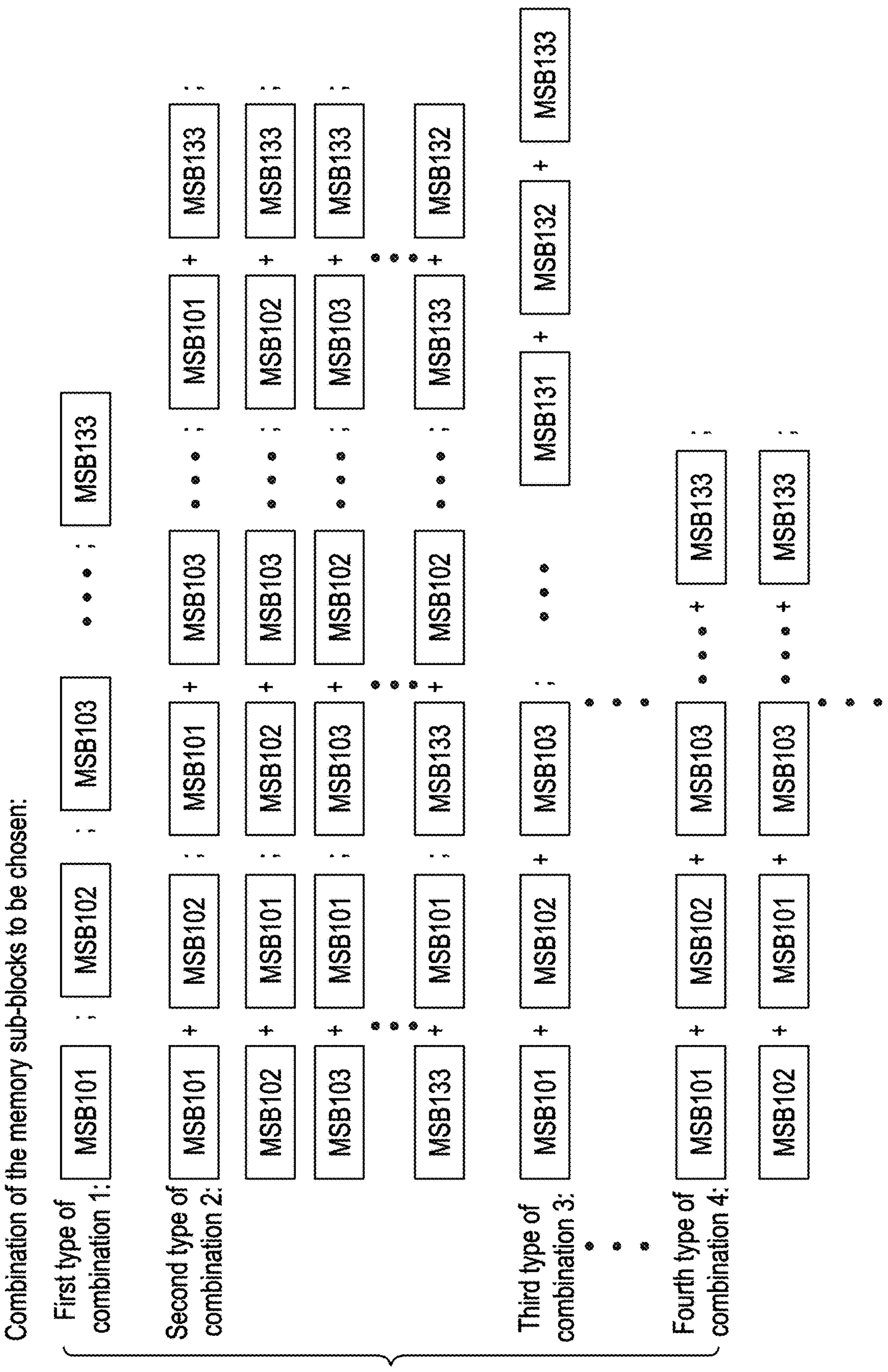
FIG. 6 is a schematic diagram of a "combination of memory sub-blocks" in step S430 of FIG. 4.

FIG. 6 is a schematic diagram of “combination of memory sub-blocks” in step S430 of FIG. 4. Here, the combination of step S430 in FIG. 4 will be described in detail based on FIG. 6. Referring to FIG. 6, it is known that 33 memory sub-blocks MSB101 to MSB133 are the M memory sub-blocks to be chosen, so the combination may include 33 types of combination. The first type of combination 1 is a combination composed of any memory sub-block to be chosen, for example, a combination composed of any one of the memory sub-blocks MSB101 to MSB133.

The second type of combination 2 is a combination of two memory sub-blocks to be chosen. For example, a combination composed of any two of the memory sub-blocks MSB101 to MSB133. If the order of the memory sub-blocks MSB101 to MSB133 in the combination is different, it is considered the same combination. By analogy, the third type of combination 3 is a combination composed of any three memory sub-blocks to be chosen. If the order of the memory sub-blocks MSB101 to MSB133 in the combination is different, it is considered the same combination.

The first type of combination 1 to the $33^{rd}$ type of combination 33 described in FIG. 6 are intended to let those who apply this embodiment know the meaning of "combination of memory sub-blocks" in step S430 of FIG. 4. Those who apply this embodiment may select one of these combinations according to needs or in a random manner based on different PUF applications. For convenience of explanation, FIG. 5 of this embodiment assumes that the combination CMSB formed by the memory sub-blocks MSB120 and MSB121 is used as the "combination of memory sub-blocks" in step S430 of FIG. 4.

Returning to step S440 in FIG. 4, the memory controller 320 selects N bits to be chosen from the plurality of bits in the preset memory area of each of the M memory sub-blocks to be chosen, wherein N is positive integer. For example, the memory sub-block MSB1 in FIG. 2 includes a plurality of memory areas, such as pages P1-0 to P1-95. The preset memory area is one of the memory areas in each of the M memory sub-blocks to be chosen. In this embodiment, the preset memory areas in the M memory sub-blocks to be chosen are all set as the default page PM-X. The number of overall bits in a single memory area (e.g., a single page) is the hardware configuration of the memory device 300, and the value of "N" is a value that the user who applies this embodiment may adjust according to needs. In this embodiment, the number of overall bits of a single page is set to "16 kB" bits, and N is assumed to be "64" bits. Therefore, in the case where the preset memory area (e.g., default page) is not selected by the user who applies this embodiment, step S440 in FIG. 4 may generate 64 permutations and combinations from 16 kB $$\left(\text{i.e., } C_{64}^{16kB}\right).$$

Through various selections from steps S420 to S440 in FIG. 4, the number of strong PUF data after performing mathematical permutations and combinations (that is, the number of "response CRPs") may be as described in equation (1):

$$Crps = C_{33}^{2000} \times 2^{33} \times C_{64}^{16kB} \quad (1)$$

In step S450 of FIG. 4, the memory controller 320 performs a weak PUF processing operation on the preset memory area (e.g., default page PM-X) of each of the M memory sub-blocks to be chosen. The weak PUF processing operation of this embodiment may be one of a gate-induced drain leakage (GIDL) erase operation, a programmed disturb operation, a read disturb operation, and a programmed operation delay operation. Those who apply this embodiment may use other methods to implement the weak PUF processing operations described in the embodiments of the present invention according to needs, as long as the critical voltages in the memory cells after the weak PUF processing operation can be randomly distributed to the left or right of the critical voltage Vr. After performing the PUF processing operation, the memory cells in the preset memory area (for example, the default page PM-X) will have randomly distributed critical voltage values, which is the basis of strong PUF data.

In step S460 of FIG. 4, the memory controller 320 controls the bit line decoder 330 and the sub-block selection circuit 340 of FIG. 3 to perform a multi-sub-block read operation on the preset memory area (for example, the default page PM-X) in the combination of the memory sub-blocks to be chosen in step S430, so as to extract strong PUF data according to the bits to be chosen (e.g., the bits to be chosen described in step S440) in the preset memory area (e.g., the default page PM-X) read through this multi-sub-block read operation.

In this embodiment, the multi-sub-block read operation performed on the page of strong PUF data is different from only reading a page in a specific memory area, but the multi-sub-block read operation simultaneously reads the bit line current in the preset memory area (e.g., default page) in one or more selected memory sub-blocks (e.g., a combination of memory sub-blocks to be chosen). Therefore, this embodiment may not only quickly obtain the selected strong PUF data to increase data throughput, but also perform mathematical permutations and combinations to obtain a large number of strong PUF data.

Please refer to FIG. 5 and FIG. 6 for the detailed steps of step S460 in FIG. 4. Specifically, in FIG. 5, the sub-block selection circuit 340 in FIG. 3 applies the first SSL cut-off voltage Voff1 to the string selection lines SSL1 to SSL100 and SSL134 to SSL2000 of the memory sub-blocks (for example, memory sub-blocks MSB1 to MSB100, MSB134 to MSB2000) of the M memory sub-blocks to be chosen not described in step S420. Moreover, the sub-block selection circuit 340 in FIG. 3 applies the second SSL cut-off voltage Voff2 to the string selection lines SSL101 to SSL119 and SSL122 to SSL133 of the memory sub-blocks (e.g., memory sub-blocks MSB101 to MSB119 and MSB122 to MSB133) in the combination not selected as the memory sub-blocks to be chosen (for example, the combination CMSB formed by the memory sub-blocks MSB120 and MSB 121 in FIG. 5). The second SSL cut-off voltage Voff2 may be equal to the first SSL cut-off voltage Voff1.

In other words, this embodiment extracts strong PUF data based on the memory sub-blocks to be chosen (e.g., memory sub-blocks MSB120 and MSB121 in FIG. 5) that are selected and formed into the combination CMSB in step S430. Therefore, not all the string selection lines of the memory sub-blocks in the combination CMSB are applied with a cut-off voltage, indicating that the memory sub-blocks corresponding to the string selection lines are not selected and not used.

The sub-block selection circuit 340 of FIG. 3 applies the selected SSL voltage VSSLs to the string selection lines (e.g., string selection lines SSL120 and SSL121) of the memory sub-blocks (for example, memory sub-blocks MSB120 and MSB121 in FIG. 5) located in the combination of the memory sub-blocks to be chosen (for example, the combination CMSB in FIG. 5). In other words, the memory sub-blocks MSB 120 and MSB 121 of FIG. 5 are selected to extract strong PUF data.

Figure 7:
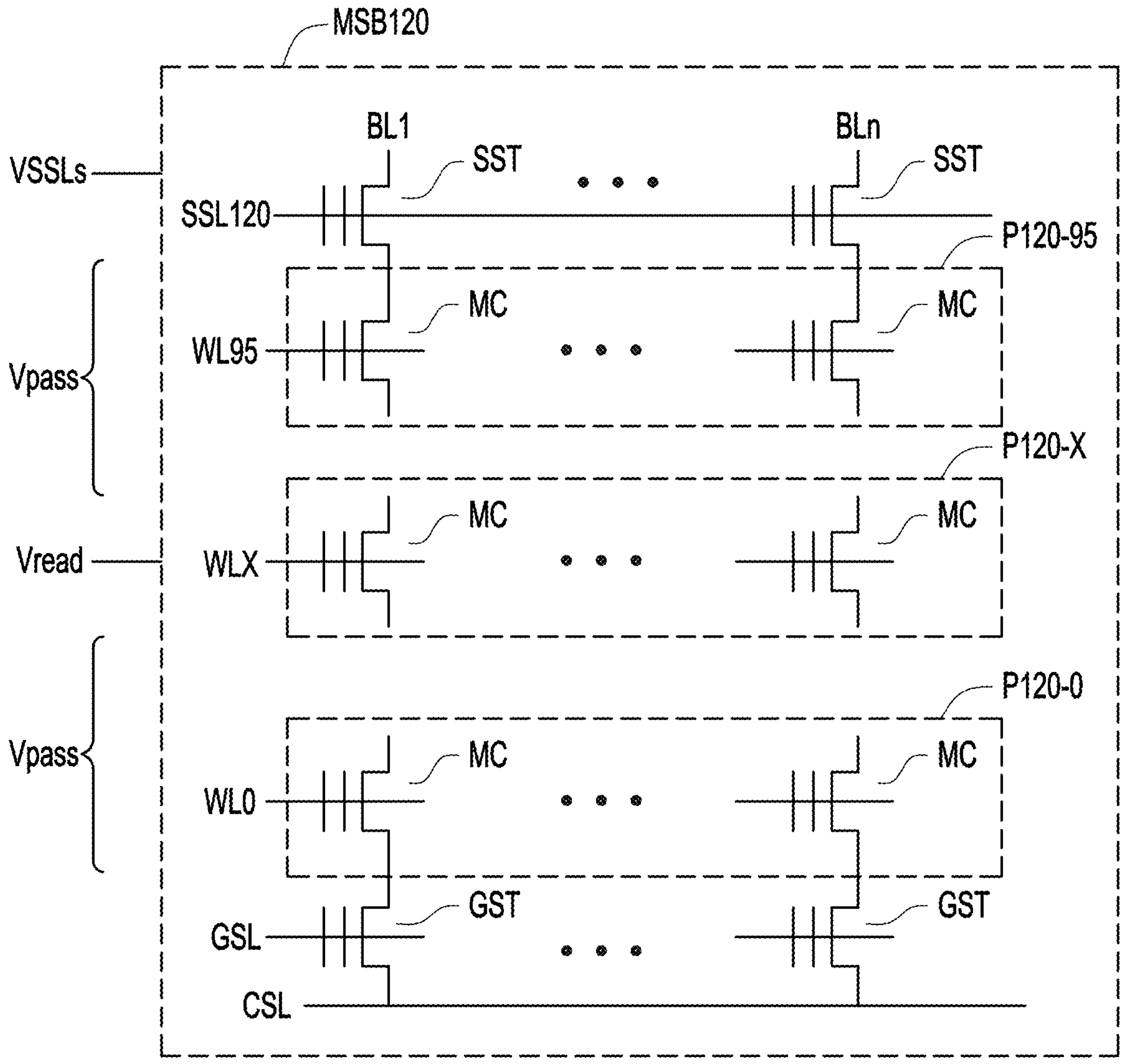
FIG. 7 is a schematic diagram of a memory sub-block MSB 120 to be chosen in the combination in step S460 of FIG. 4.

FIG. 7 is a schematic diagram of a memory sub-block MSB 120 to be chosen in the combination CMSB in step S460 of FIG. 4. For convenience of explanation, the memory sub-block MSB120 to be chosen in FIG. 7 is taken as an example of the memory sub-block to be chosen located in the combination CMSB. The preset memory area of the memory sub-block MSB120 is page P120-X. Referring to FIG. 7, the read voltage Vread is applied to the word line WLX located in the preset memory area (page P120-X) in the combination CMSB of the memory sub-block MSB 120 to be chosen.

Moreover, the pass voltage Vpass is applied to the word lines WL0 to WLX-1 and WLX+1 to WL95 of other memory areas (for example, pages P120-0 to P120-X−1, P120-X+1 to P120-95) located outside the preset memory area (page P120-X) in the combination CMSB of the memory sub-blocks to be chosen.

In this way, the plurality of sense amplifiers SA 350 in the word line decoder 330 of FIG. 3 may obtain a plurality of bit line currents according to the preset memory area (page P120-X) in the combination CMSB of the memory sub-blocks to be chosen and the corresponding bit line. The bit lines sensed by the sense amplifier SA 350 may be bit lines corresponding to N (e.g., N equals to 64) bits to be chosen in step S440 of FIG. 4.

In this way, the memory controller 320 of FIG. 3 may determine whether the bit value of each corresponding strong PUF data in the bits to be chosen (for example, the 64 bits to be chosen in step S440 of FIG. 4) for the preset memory area (page P120-X) is the value "0" or value "1" according to each of the aforementioned bit line currents and the preset "sensing current reference value".

In detail, the calculation method of "sensing current reference value RSC" may be as described in equation (2):

$$RSC = \frac{1}{2} \times M(33) \times ABLC \tag{2}$$

ABLC is expressed as the current value of the bit line in each memory cell string. The sensing current reference value RSC is proportional to the number (that is, "M" (for example, M equals to 33)) of the memory sub-blocks to be chosen.

Figure 8:
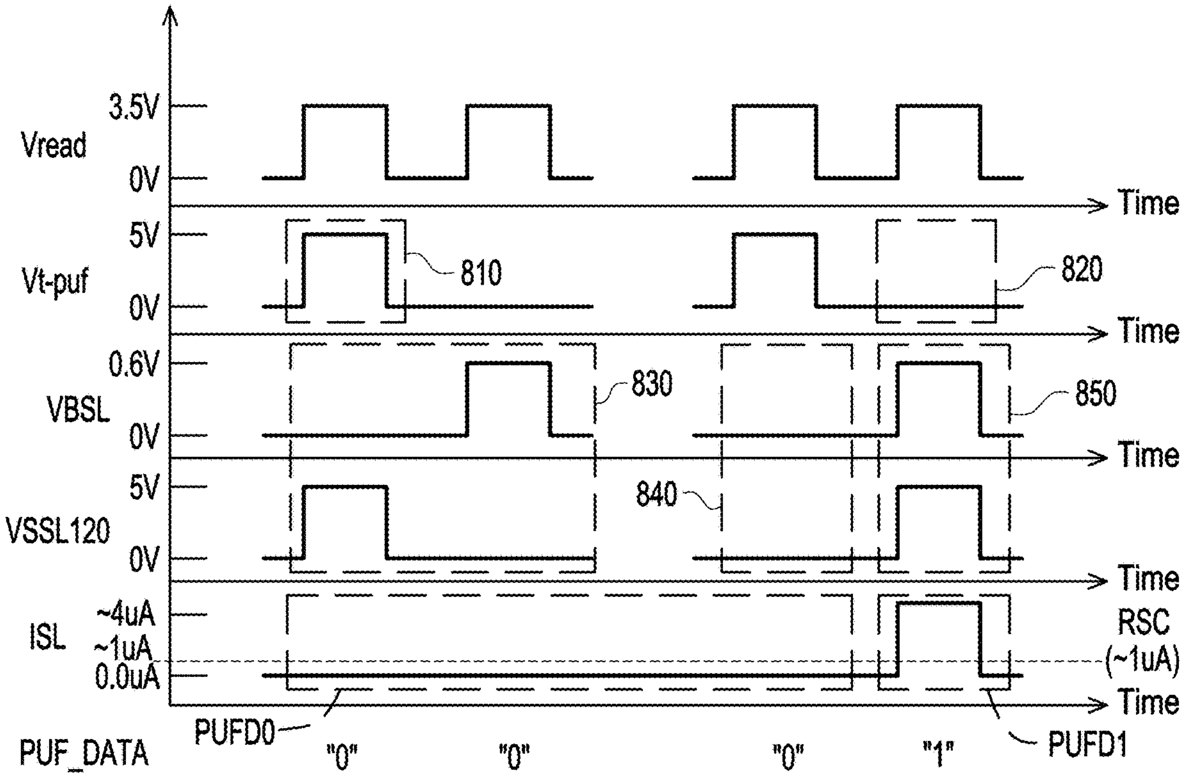
FIG. 8 is a schematic diagram of various signals in a multi-sub-block read operation of step S460 in FIG. 4.

FIG. 8 is a schematic diagram of various signals in a multi-sub-block read operation of step S460 in FIG. 4. FIG. 8 shows the read voltage Vread on the word line WLX provided to the preset memory area (e.g., page P120-X), the threshold voltage Vt-puf of the memory cell as the bits to be chosen on the memory sub-block MSB 120, the bit line voltage VBSL, the string selection line voltage VSSL120 of the memory sub-blocks to be chosen (for example, the memory sub-block MSB 120 in FIG. 5) and the bit line current ISL corresponding to the bits to be chosen. The sensing current reference value RSC (approximately 1 uA) is marked on the waveform of the bit line current ISL in FIG. 8.

In detail, the threshold voltage Vt-puf of the memory cell represents accessing information about the so-called weak PUF. The mark 810 in FIG. 8 represents the threshold voltage Vt-puf (5V) in the condition where the memory cell as the bits to be chosen has a value of "0" in the weak PUF. The mark 820 in FIG. 8 represents the threshold voltage Vt-puf (0V) in the condition where the memory cell as the bits to be chosen has a value of "1" in the weak PUF. The marks 810 and 820 in FIG. 8 represents that different threshold voltages are corresponding to different PUF values in the weak PUF.

In this embodiment of the invention, the weak PUF (i.e., the threshold voltage Vt-puf in FIG. 8) is generated (i.e., step S450 in FIG. 4, the Vt-puf in FIG. 8) and existed in the corresponding pages beforehand the multi-sub-read operation (i.e., step S460 in FIG. 4), and then exists in a specific PAGE. The bit line current ISL represents the result (i.e., the strong PUF data) performed by the multi-sub-block read operation of the step S460 in FIG. 4.

The bit line voltage VBSL of FIG. 8 is in the enabled state (e.g., 0.6V) when corresponding to the bits to be chosen, and the bit line voltage VBSL of FIG. 8 is in the disabled state (e.g., 0V) when corresponding to the bits not to be chosen. The string selection line voltage VSSL120 in FIG. 8 is in the enabled state (e.g., 5V) when being used as the selected memory sub-blocks to be chosen (e.g., the memory sub-block MSB120 in FIG. 5), and the string selection line voltage VSSL120 in FIG. 8 is in the disabled state (e.g., 0V) when being used as the memory sub-blocks not to be chosen.

The mark 830 in FIG. 8 indicates one of the bit line voltage VBSL and the string selection line voltage VSSL120 is in the enabled state. The bit value "0" of the strong PUF data PUF_DATA is presented as mark PUFD0 (that is, the bit value corresponding to the "response" is "0"). The mark 840 in FIG. 8 indicates that when both the bit line voltage VBSL and the string selection line voltage VSSL120 are in the disabled state, it indicates that PUF data will not be extracted accordingly. The mark 850 in FIG. 8 indicates that when the bit line voltage VBSL and the string selection line voltage VSSL120 are both in the enabled state, it indicates that the bit value of the strong PUF data PUF_DATA will be equal to the value (for example, value "1") presented by the memory cell as the bit to be chosen. The bit value "1" of the strong PUF data PUF_DATA is presented as mark PUFD1 (that is, the bit value corresponding to the "response" is "1"). In this embodiment, the bit value corresponding to "response" in the mark 850 in FIG. 8 is "1".

In summary, the extraction method for a physically unclonable function (PUF) and the memory device described in the embodiments of the present invention are operated mainly based on the existing hardware structure (e.g., bit line decoder, sub-block selection circuit) of the memory device and some additional hardware (e.g., corresponding functions added to the memory controller) while utilizing the selection of the memory device on each memory sub-block, the selection of the memory device on the combination of memory sub-blocks, the selection of the memory device on the preset memory area (such as the default page in the memory sub-block) in the memory sub-block, and the selection of the memory device on a plurality of bits in the preset memory area, thereby performing mathematical permutations and combinations to extract a large amount of strong PUF data. Moreover, in this embodiment, the strong PUF data may be extracted without setting an additional comparator circuit, and the data throughput of strong PUF data may be increased.

Although the present disclosure has been disclosed above through embodiments, it is not intended to limit the present disclosure. Anyone with ordinary knowledge in the technical field can make some modifications and refinement without departing from the spirit and scope of the present disclosure. Therefore, the scope to be protected by the present disclosure shall be determined by the appended claims.

What is claimed is:

1. An extraction method for a physically unclonable function (PUF), comprising:

providing a memory block, wherein the memory block comprises a plurality of memory sub-blocks, the memory sub-blocks comprise a plurality of memory cells, the memory cells are divided into a plurality of memory areas, and each of the memory sub-blocks further comprises a string selection line (SSL);

selecting a plurality of memory sub-blocks to be chosen among the memory sub-blocks;

forming a combination of the memory sub-blocks to be chosen among the memory sub-blocks to be chosen;

selecting a plurality of bits to be chosen among a plurality of bits of a preset memory area in each of the memory sub-blocks to be chosen; wherein the preset memory area is one of the memory areas in each of the memory sub-blocks to be chosen;

performing a weak PUF processing operation on the preset memory area in each of the memory sub-blocks to be chosen; and performing a multi-sub-block read operation on the preset memory area in the combination of the memory sub-blocks to be chosen to extract a strong PUF data according to the bits to be chosen in the preset memory area read through the multi-sub-block read operation, comprising:

applying a first SSL cut-off voltage to the string selection line of the memory sub-blocks that are not the memory sub-blocks to be chosen;

applying a second SSL cut-off voltage to the string selection line of the memory sub-blocks in the combination that is not selected as the memory sub-blocks to be chosen;

applying a selected SSL voltage to the string selection line of the memory sub-blocks in the combination of the memory sub-blocks to be chosen;

applying a read voltage to a word line of the preset memory area in the combination of the memory sub-blocks to be chosen;

applying a pass voltage to a word line of the memory areas outside the preset memory area in the combination of the memory sub-blocks to be chosen;

obtaining a plurality of bit line currents according to the preset memory area in the combination of the memory sub-blocks to be chosen; and determining a bit value of the strong PUF data corresponding to each of the bits to be chosen for the preset memory area based on each of the bit line currents and a sensing current reference value, wherein the sensing current reference value is proportional to the number of the memory sub-blocks to be chosen.

2. The extraction method according to claim 1, wherein each of the memory areas is one page or part of the page among a plurality of pages of the memory block, and the memory cells in the page are coupled to a same word line.

3. The extraction method according to claim 1, wherein the combination of the memory sub-blocks to be chosen comprises at least one memory sub-block in the memory block and a combination thereof.

4. The extraction method according to claim 1, wherein the weak PUF processing operation is one of a gate-induced drain leakage (GIDL) erase operation, a programmed disturb operation, a read disturb operation, and a programmed operation delay operation.

5. A memory device, comprising:

a memory array comprising a memory block, wherein the memory block comprises a plurality of memory sub-blocks, the memory sub-blocks comprise a plurality of memory cells, the memory cells are divided into a plurality of memory areas, and each of the memory sub-blocks further comprises a string selection line (SSL);

a memory controller coupled to the memory array;

a bit line decoder coupled to the memory controller; and a sub-block selection circuit coupled to the memory controller, wherein the memory controller is configured to:

select a plurality of memory sub-blocks to be chosen among the memory sub-blocks;

form a combination of the memory sub-blocks to be chosen among the memory sub-blocks to be chosen;

select a plurality of bits to be chosen among a plurality of bits of a preset memory area in each of the memory sub-blocks to be chosen, wherein the preset memory area is one of the memory areas in each of the memory sub-blocks to be chosen;

perform a weak PUF processing operation on the preset memory area in each of the memory sub-blocks to be chosen; and perform a multi-sub-block read operation on the preset memory area in the combination of the memory sub-blocks to be chosen by controlling the bit line decoder and the sub-block selection circuit to extract a PUF data according to the bits to be chosen in the preset memory area read through the multi-sub-block read operation, wherein in a condition of performing the multi-sub-block read operation through the memory controller, the sub-block selection circuit applies a first SSL cut-off voltage to the string selection line of the memory sub-blocks that are not the memory sub-blocks to be chosen, the sub-block selection circuit applies a second SSL cut-off voltage to the string selection line of the memory sub-blocks in the combination that is not selected as the memory sub-blocks to be chosen, the sub-block selection circuit applies a selected SSL voltage to the string selection line of the memory sub-blocks in the combination of the memory sub-blocks to be chosen, a read voltage is applied to a word line of the preset memory area in the combination of the memory sub-blocks to be chosen, a pass voltage is applied to a word line of the memory areas outside the preset memory area in the combination of the memory sub-blocks to be chosen, the bit line decoder obtains a plurality of bit line currents according to the preset memory area in the combination of the memory sub-blocks to be chosen, and the memory controller determines a bit value of the strong PUF data corresponding to each of the bits to be chosen for the preset memory area based on each of the bit line currents and a sensing current reference value, wherein the sensing current reference value is proportional to the number of the memory sub-blocks to be chosen.

6. The memory device according to claim 5, wherein each of the memory areas is one page or part of the page among a plurality of pages of the memory block, and the memory cells in the page are coupled to a same word line.

7. The memory device according to claim 5, wherein the combination of the memory sub-blocks to be chosen comprises at least one memory sub-block in the memory block and a combination thereof.

8. The memory device according to claim 5, wherein the weak PUF processing operation is one of a gate-induced drain leakage (GIDL) erase operation, a programmed disturb operation, a read disturb operation, and a programmed operation delay operation.

9. An extraction method for a physically unclonable function (PUF), comprising:

providing a memory block, wherein the memory block comprises a plurality of memory sub-blocks, the memory sub-blocks comprise a plurality of memory cells, the memory cells are divided into a plurality of memory areas, and each of the memory sub-blocks further comprises a string selection line (SSL);

selecting M memory sub-blocks to be chosen from the memory sub-blocks, wherein M is a positive integer;

forming a combination of the memory sub-blocks to be chosen among the M memory sub-blocks to be chosen;

selecting N bits to be chosen among a plurality of bits of a preset memory area in each of the M memory sub-blocks to be chosen, wherein N is a positive integer, the preset memory area is one of the memory areas in each of the M memory sub-blocks to be chosen;

performing a weak PUF processing operation on the preset memory area in each of the M memory sub-blocks to be chosen; and performing a multi-sub-block read operation on the preset memory area in the combination of the memory sub-blocks to be chosen to extract a strong PUF data according to the N bits to be chosen in the preset memory area read through the multi-sub-block read operation, comprising:

applying a first SSL cut-off voltage to the string selection line of the memory sub-blocks that are not the M memory sub-blocks to be chosen;

applying a second SSL cut-off voltage to the string selection line of the memory sub-blocks in the combination that is not selected as the memory sub-blocks to be chosen;

applying a selected SSL voltage to the string selection line of the memory sub-blocks in the combination of the memory sub-blocks to be chosen;

applying a read voltage to a word line of the preset memory area in the combination of the memory sub-blocks to be chosen;

applying a pass voltage to a word line of the memory areas outside the preset memory area in the combination of the memory sub-blocks to be chosen;

obtaining a plurality of bit line currents according to the preset memory area in the combination of the memory sub-blocks to be chosen; and determining a bit value of the strong PUF data corresponding to each of the N bits to be chosen for the preset memory area based on each of the bit line currents and a sensing current reference value, wherein the sensing current reference value is proportional to the number of the memory sub-blocks to be chosen.

10. The extraction method according to claim 9, wherein each of the memory areas is one page or part of the page among a plurality of pages of the memory block, and the memory cells in the page are coupled to a same word line.

11. The extraction method according to claim 9, wherein the combination of the memory sub-blocks to be chosen comprises at least one memory sub-block in the memory block and a combination thereof.

12. The extraction method according to claim 9, wherein the weak PUF processing operation is one of a gate-induced drain leakage (GIDL) erase operation, a programmed disturb operation, a read disturb operation, and a programmed operation delay operation.

* * * * *